United States Patent [19]

Kren et al.

[11] 4,282,483

[45] Aug. 4, 1981

[54] PROBE FOR DETERMINING P OR N-TYPE CONDUCTIVITY OF SEMICONDUCTOR MATERIAL

[75] Inventors: George J. Kren, Los Altos; Karel Urbanek, Atherton; William R. Wheeler, Saratoga, all of Calif.

[73] Assignee: Tencor Instruments, Mountain View, Calif.

[21] Appl. No.: 69,272

[22] Filed: Aug. 24, 1979

Related U.S. Application Data

[63] Continuation-in-part of Ser. No. 39,303, May 15, 1979, which is a continuation-in-part of Ser. No. 941,233, Sep. 11, 1978, abandoned.

[51] Int. Cl.³ ............................................. G01R 31/26
[52] U.S. Cl. ............................. 324/158 R; 324/158 D
[58] Field of Search ............ 324/158 R, 158 D, 158 T

[56] References Cited

PUBLICATIONS

1968 Book of ASTM Standards; ASTM Designation: F42-68T; 1968; pp. 536-541.
Poponiak, et al., "Detecting Conductivity-Type . . . ", IBM Tech. Dis. Bull., vol. 14, No. 1, Jun. 1971, p. 100.

Primary Examiner—Ernest F. Karlsen
Attorney, Agent, or Firm—Thomas Schneck

[57] ABSTRACT

A probe for determining the p or n-type of semiconductor material wherein a conductive wire is positioned for point contact with the semiconductor, forming a diode. The wire is energized by r.f. current passing through a capacitor so that the current is rectified at the diode, charging the capacitor. A voltage comparator is connected to the capacitor for determining the polarity of charge on the capacitor and hence the p or n-type of the semiconductor wafer. The semiconductor is supported on a non-diffusing dielectric over a conductive carrier such that r.f. current passes through the dielectric to the carrier, thereby completing the circuit.

26 Claims, 9 Drawing Figures

PROBE FOR DETERMINING P OR N-TYPE CONDUCTIVITY OF SEMICONDUCTOR MATERIAL

CROSS REFERENCE TO RELATED APPLICATIONS

This is a continuation-in-part of application Ser. No. 39,303 filed May 15, 1979, which is a continuation-in-part of application Ser. No. 941,233 filed Sept. 11, 1978, the latter now abandoned.

BACKGROUND OF THE INVENTION a. Field of the Invention

The invention relates to a probe for determining the "p" or "n" type conduction characteristic of a semiconductor.

b. Prior Art

In semiconductors, conduction of electricity is explained in terms of majority and minority carriers of electric charge. In n-type semiconductor materials, electrons are the majority carriers and holes, i.e. the spaces left by electrons, are the minority carriers. In p-type semiconductor materials the opposite is true: the holes are the majority carriers and the electrons are the minority carriers.

Semiconductor integrated circuits are often fabricated on a semiconductor wafer substrate, usually by methods similar to those described in U.S. Pat. No. 3,025,589 to J. A. Hoerni. It is necessary at the outset to know the p or n-type conduction characteristic of the wafer substrate.

Conduction type is determined by the kind of impurities, or dopants, added to pure silicon or germanium or the like to transform the pure material into a semiconductor. For example, if a trivalent impurity, such as boron, is added to a pure silicon crystal, a p-type semiconductor material results. On the other hand, if the chemical impurity, or dopant, has a valence of five, such as phosphorus, an excess electron would result with respect to each silicon atom. Phosphorus thus forms an n-type semiconductor material because electrons are the majority carrier.

Although manufacturers of semiconductor substrates, such as silicon and germanium wafers, specify p or n-type, sometimes the specification for a wafer is not known because of mix-ups in handling of the wafers, or other reasons. If integrated circuit manufacturers fail to test each wafer to be fabricated into a batch of hundreds of integrated circuits, one or more bad batches may occur. The time and expense for processing a batch is considerable in view of the relatively large amount of capital equipment required for wafer processing. Therefore, for quality control purposes, many manufacturers have a need for testing the p or n-type of each wafer to be processed.

Previously, manufacturers have used the "hot probe" technique to measure p or n-type. A hot probe consists of two electrodes, one of which is hot. The electrodes are placed in contact with a wafer, which is locally heated, increasing the mobility of majority carriers. Carriers flow away from the heated spot, causing the spot to acquire electrical charge opposite to the majority carriers. While the hot probe is widely used it is destructive because of thermal shock to the material tested.

Another test for p or n-type involves forming a contact diode with a wafer by means of a probe. The direction of current flow, either d.c. or a.c., through the diode indicates conduction type. The wafer usually sits on a conductive support to complete the circuit from the probe. A problem is that the metal support can readily contaminate large areas of the wafer.

An object of the present invention is to devise a non-destructive test method and apparatus for more quickly determining the p or n-type conduction characteristic of semiconductor materials, without contamination of the materials.

SUMMARY OF THE INVENTION

The above object has been achieved by using a conductive probe to form a p-n junction with a semiconductor, electrically charging the probe with radio frequency current through a capacitor and then sensing the direction of charge on the capacitor as an indirect indication of the polarity of the p-n junction. If the capacitor charges one way, the semiconductor is p-type; if the capacitor charges oppositely, the semiconductor is n-type. The capacitor is charged by an r.f. oscillator and the capacitor is sensed by at least one voltage comparator referenced to a fixed voltage level. The semiconductor is supported on a non-diffusing dielectric coating over a conductive carrier, such that r.f. current passes through the coating of the carrier, thereby completing the circuit. A display device or data recording equipment receives the output indication signal for use.

An advantage of the invention is that the p or n-type conduction characteristic of a semiconductor may be very rapidly and simply determined without destruction or contamination of the material.

DESCRIPTION OF THE PREFERRED EMBODIMENT

Figures 1, 2:
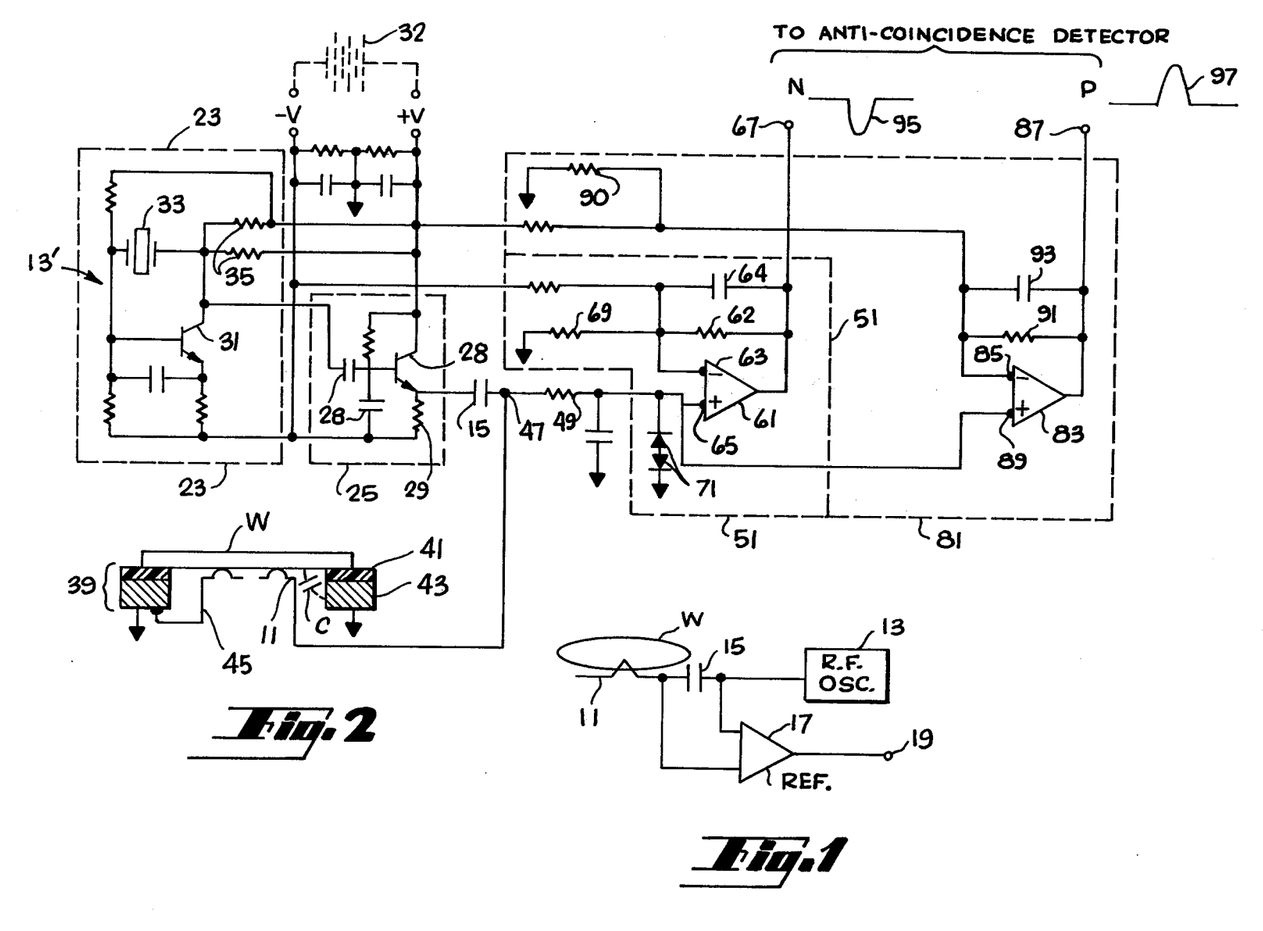
FIG. 1 is a simplified electrical schematic of the semiconductor probe of the present invention.
FIG. 2 is a more detailed electrical schematic of the semiconductor probe of FIG. 1.

With reference to FIG. 1 a probe or V-shaped conductive wire 11 is shown to be in physical and electrical contact with wafer W. Wafer W is resting on an anodized aluminum carrier, not shown, which is non-conductive relative to the wafer, but there is capacitive coupling between the aluminum of the carrier and the wafer W through the anodized coating. Wire 11 is energized by a radio frequency oscillator 13 which operates at approximately 10 MHz. The r.f. energy from oscillator 13 is fed through a very small capacitor 15 having a value of approximately 50 pf.

In operation, the wire 11 and wafer W act as a diode at their contact point. Energy is delivered through capacitor 15 into wire 11 and a charge is built up on capacitor 15, with the direction of charge depending on the polarity of the diode junction formed between wire 381 and wafer W. The circuit is completed through a dielectric coated conductive wafer carrier, not shown, which is capacitively coupled to wafer W with the capacitive value being approximately 10 times the capacitive value of the capacitor 15. If the wafer W has one polarity, i.e. p or n-type, the capacitor 15 will be charged in one direction; if the water W has another polarity, the capacitor 15 will be charged in the opposite direction. The charge on capacitor 15 is sensed by an operational amplifier 17, having a high input impedance, acting as a voltage comparator which puts out a positive or negative signal at output node 19 with respect to a reference voltage which is supplied to the amplifier. The positive or negative polarity characteristic of the wafer indicates its semiconductor type, p or n by means of a corresponding signal at node 19.

To discharge the dielectric coating of the carrier before or after a measurement, a single grounded contact touches the bottom surface of the wafer. Because the wafer being tested has conductivity and the carrier is conductive, the grounded contact between them discharges the charge on the dielectric coating of the carrier in the same way a bleeder resistor operates. During a measurement, the r.f. path through capacitor 15 and through the dielectric coating of the wafer carrier is the major current path and the path through the grounded contact is not significant. A wafer carrier is not required as discussed below with reference to FIG. 4.

In FIG. 2, the electrical configuration of FIG. 1 may be viewed in more detail. The r.f. oscillator 13' enclosed within dashed line 23 may be seen to comprise a transistor 31 connected as an oscillator whose frequency is controlled by a crystal 33 connected between the base and collector thereof. Crystal control is not necessary, but merely preferred. Suitable load members 35 are used to complete the oscillator circuit. The frequency of the oscillator is not critical, but a radio frequency having a wavelength which is long compared to the probe dimension is preferred in order to limit r.f. interference. The selected frequency should also be able to couple through the dielectric coating to the carrier, if one is used, and to ground so that a complete circuit can be formed. Sine waves are preferred, but clipped waves or square waves may be used as long as r.g. interference can be contained.

A transistor amplifier, within the dashed line 25, of the emitter follower type, has input d.c. blocking capacitors 27 and a load resistor 29. The amplifier includes transistor 28 which amplifies the output of oscillator 23 and sends the amplified r.f. signal through capacitor 15 to the first conductive wire 11 which makes contact with wafer W. Contact can be very light because r.f. current is easily transferred to the wafer.

All materials in this instrument, including the carrier 29 and first wire 11, which contact wafer W, are made of materials which will not readily diffuse into, or otherwise contaminate, the wafer. For this reason, first wire 11 is made of tungsten and the carrier 39 is made of anodized aluminum with the anodized coating 41 forming a dielectric barrier between the aluminum base portion 43 of the carrier and the wafer W which is placed on top of the anodized layer and in contact with wire 11. Electrostatic charge built up on the wafer is discharged through a second conductive wire 45, connected to ground at one end and positioned so that its free end contacts wafer W, but not first wire 11. The grounding contact 45 acts as a bleeder resistor to discharge wafer W before or after a measurement, as mentioned previously. Grounding contact 45 is not essential, but serves to discharge the semiconductor material to be measured so that the same measurement can be accurately repeated, or that the initial measurement will be more reliable, since handling a wafer can induce static charge. Note that the wire 11 and grounding contact 45 need not be V-shaped, but such a shape helps to make physical and electrical contact with wafer W. Contact can be very light because r.f. current is easily transferred to the wafer.

When p or n type of a wafer is measured, the capacitor 15 is charged with a polarity depending on the positive or negative polarity type of the wafer because of the polarity of the point contact diode formed between the wire 11 and the wafer itself. This diode formed between the wire 11 and wafer W rectifies the radio frequency current coming through capacitor 15 and thus charges the capacitor to a positive or negative polarity at charging node 47. The charge at node 47 is sensed by one or more operational amplifiers connected as voltage comparators which with ancillary components are enclosed by the dashed lines 51, 81. To make a measurement an r.f. current pulse of about 100 milliseconds is used, although that time is not critical. After a measurement the charge of capacitor 15 at node 47 bleeds into the input impedance of operational amplifier 61 or 83, as well as into wafer W and to ground via wire 45.

A first comparator surrounded by dashed line 51 includes an integrated circuit operational amplifier 61 which may be for example, type CA 3140, which has an inverting input terminal 63 connected to a negative supply so that the amplifier output at terminal 67 is usually positive, except when an n-type wafer is detected. An n-type wafer causes a negative signal from capacitor 15 to be detected through resistor 49 at the non-inverting input 65. The negative signal is amplified and transmitted to the output terminal 67. Resistor 69 established a proper working point for the operational amplifier 61, while diodes 71 form a large resistance for biasing the operational amplifier input with respect to ground. Resistor 62 and capacitor 64 provide feedback for the operational amplifier.

A second comparator surrounded by dashed line 81 includes an integrated circuit operational amplifier 83, which may be identical to integrated circuit operational amplifier 61. The operational amplifier has an inverting input terminal 85 connected to a positive supply so that the amplifier output at terminal 87 is usually negative, except when a p-type wafer is detected. A p-type wafer causes a positive signal from capacitor 15 to be detected through resistor 49 at the non-inverting input 89. The positive signal is amplified and transmitted to the output terminal 87. Resistor 90 establishes a proper working point for the amplifier 83, while diodes 71 form a large resistance' for biasing the operational amplifier input with respect to ground. Resistor 91 and capacitor 93 are feedback devices for making the operational amplifier 83 into a voltage comparator, with hysteresis, similar to resistor 62 and capacitor 64 connected across operational amplifier 61.

When an n-type wafer is detected a negative going pulse, such as pulse 95 is detected at terminal 67 while the output at terminal 87 remains essentially constant. On the other hand, when a p-type wafer is detected the output at terminal 67 remains constant, but the output at terminal 87 goes positive, as indicated by the pulse 97. In the event that a wafer triggers both a negative pulse at output node 67 and a positive pulse at node 87, an error has occurred in the system. Such an error may be detected by an anti-coincidence detector which looks for two output pulses occurring at the same time. When such an event is detected, an error is signalled. Under normal conditions, only one output pulse from either terminal 67 or 87 should be detected at one time.

A battery 32 may be connected to positive and negative voltage terminals V+ and V− to power the apparatus of the present invention. A switch, not shown, may be provided for connecting battery 32 to the circuit of FIG. 2 when a measurement is required. Such a switch may be a button as shown in FIG. 3 or a trigger as shown in FIG. 4.

In FIG. 2, two voltage comparators 51 and 81 have been shown to be used for the purpose of detecting the charge on capacitor 15. For purposes of simplicity, only one comparator 51 needs to be used. If only one comparator is used, a wafer is assumed to be p-type, unless a negative pulse is received at terminal 67. Besides using voltage comparators, other types of electronic devices could be used to sense the charge across capacitor 15, such as oscilloscopes or other devices.

Figure 3:
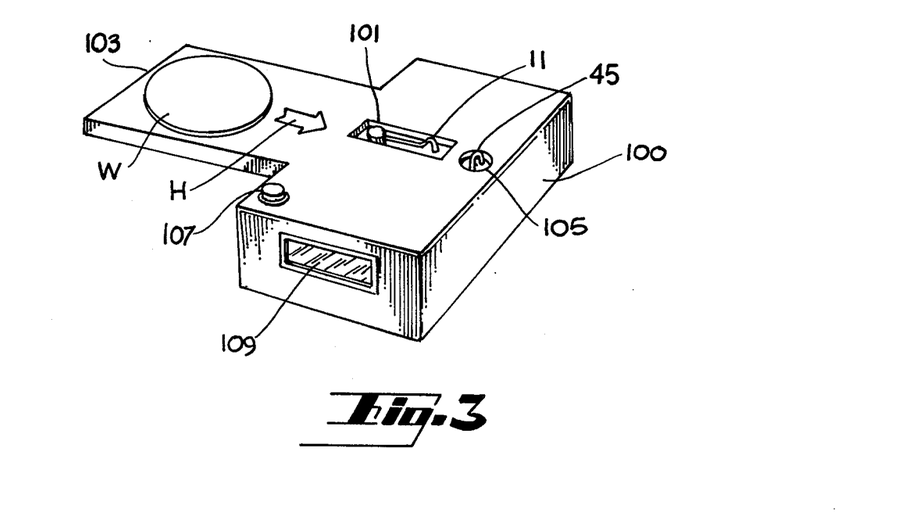
FIG. 3 is a perspective view of a housing for the probe of FIG. 1.
Figure 4:
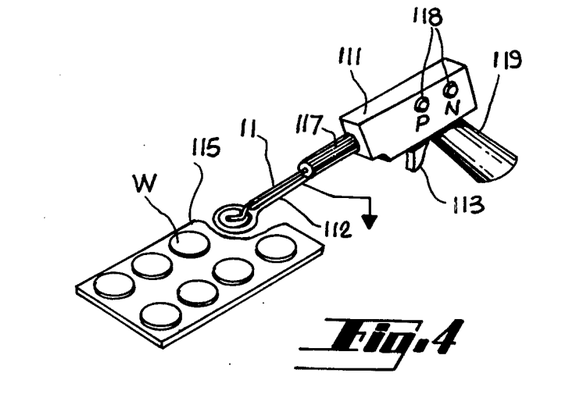
FIG. 4 is an alternate housing for the probe shown in FIG. 1.

Exemplary housings for such a separate probe instrument are shown in FIGS. 3 and 4. With respect to FIG. 3, the housing is a box-like chassis 100 having the first wire 11 projecting from a slot 101 such that a wafer W on a wafer feeding member 103 moving in the direction of arrow H will come into contact with the first wire 11. The second wire 45 projects through a separate aperture 105 with the first and second wires 11, 45 making contact with the underside of wafer W. A measurement of wafer type is made by keying the transistor oscillator by manual means, such as a push button 107. A visual indication of wafer type may be read on a visual display 109. It will be realized that the wire 45 is grounded to the anodized aluminum chassis 100 which is in capacitive relation to the wafer W since the anodized coating forms a dielectric between the wafer and the aluminum layer below it. The chassis 100 need not be anodized aluminum, but could be an insulative material, such as plastic.

In FIG. 4, a hand held probe is shown for measuring wafer p or n type, either while a wafer is supported on a carrier or on wafer shipping trays or other holders, including support by hand. The hand held unit resembles a soldering gun in which forwardly projecting wire 11 is a fine wire made of a material which will not diffuse into the wafer. Like a soldering gun, the body 111 has a trigger or button 113 for energizing the circuit shown in FIG. 2 and a pistol grip or handle 119. The wire 11 is intended to make contact with one side of a wafer, while second wire 112 also makes contact, the wafer supported on a non-conductive surface, such as the insulative transporting device 115. In this case the conductive wire 112 provides a capacitive path to ground so that a dielectric coated conductive wafer carrier is not required to make a measurement. In order to make good contact and to be in a capacitive relation to wire 11, wire 112 has a circular shape surrounding wire 11 in the region where wafer contact is expected. The circular shape is smaller than a wafer to be measured. Both wires 11 and 112 emerge from gun barrel 117 in a parallel, mutually non-contacting relation, but both wires are adapted to contact a wafer. The measurement is made by keying the transistor oscillator by means of the trigger 113 and obtaining a determination of the p or n type in a visual display, for example two light emitting diodes 118 which may indicate either wafer type. The apparatus may be powdered by battery supplies, as is customary for many integrated circuit products.

One of the advantages of the hand held probe of FIG. 4 is that silicon wafers can be tested while stacked in parallel, spaced apart alignment in a wafer carrier or tray.

Figure 5:
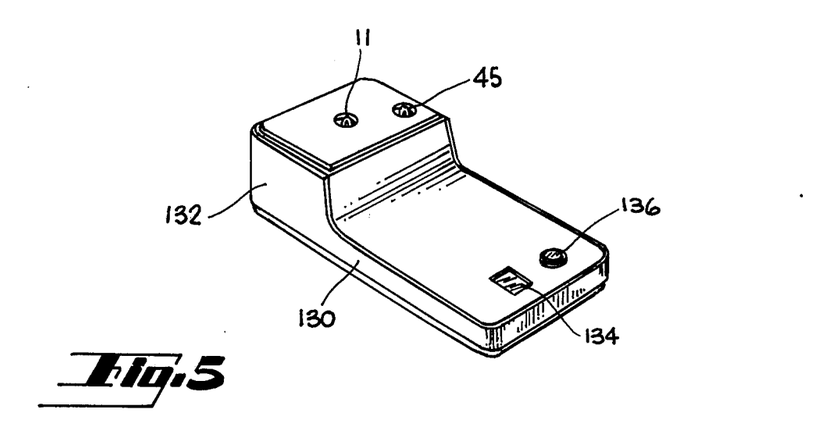
FIG. 5 is another alternate housing for the probe shown in FIG. 1.

FIG. 5 shows a housing similar to that shown in FIG. 3. In FIG. 5 there is a chassis 130 having a mesa or table region 132 which is generally rectangular in shape. The upper portion of mesa 132 is adapted to fit between tracks or rails or conveyor belts of a wafer handling system. In such a system, opposed rails or belts are provided which are less than the width of a semiconductor wafer. These rails or belts, straddle mesa 132 and bring a wafer over the top of the mesa. The wafer passes over the first wire 11 projecting from a hole in the top of the mesa such that the wire contacts the wafer so that a point contact diode can be formed. A second wire 45 also projecting from the mesa may contact the wafer in order to discharge any charge thereon. The mesa surface is preferably anodized aluminum so that the surface of the mesa forms a dielectric between the underlying aluminum base and the water itself. A visual display 134 is provided for reading wafer type and a push button 136 is provided for activating the circuit. Alternatively, the circuit may be activated automatically by a sensor, such as an optical detector, when the wafer is directly over the first wire 11 as well as the second wire 45.

Figure 6:
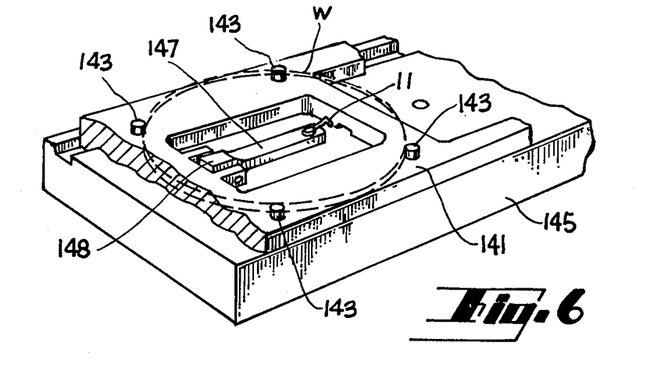
FIG. 6 is a mechanical detail of a probe of the present invention mounted for automated wafer handing.

FIG. 6 shows a wafer transport of a type adapted to be used in automated wafer handling. A wafer carrier 141 has pins 143 which fix the position of a wafer, indicated by the dashed lines W. The carrier 141 is driven along a base 145 from one position to another. In the process of being moved, the wafer is tested for conductivity type. This is achieved by mounting the first wire 11 of the probe of the present invention on a lever arm 147 which is pivoted at end 148. The first wire 11, mounted at the end opposite to end 148 is kept away from the wafer W except at a test point where the wire is pushed into contact with the wafer by a cam which causes upward rotation of the level 147.

Figure 7:
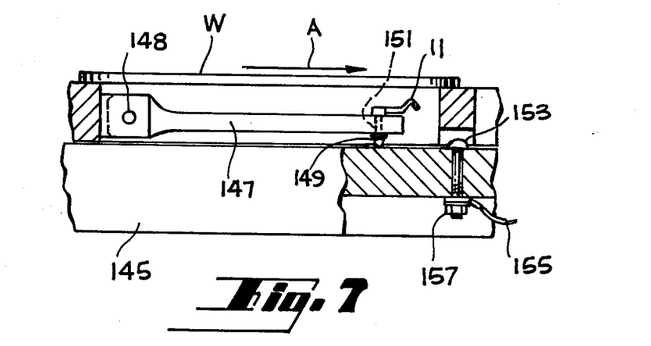
FIG. 7 is a first operational side sectional view of the mechanical detail of FIG. 6.

This mechanical action is illustrated with reference to FIG. 7. In that figure, the lever arm 147, made of insulating material, is shown to be in a down position relative to base 145. The wafer carrier 141 is moving over base 145 in the direction indicated by arrow A. The wire 11 is connected to a conductive cam follower 149 by means of an electrical feed-through 151. Intended to make contact with cam follower 149 is a cam 153 which is stationary and connected through base 145 to an electrical terminal 155. The cam 153 may be the rounded head of a conductive bolt having an insulated sleeve over the shank of the bolt so that the bolt is not shorted to the base 145. A nut 157 may then be threaded on the end of the shank to keep electrical terminal 155 mechanically in place.

Figure 8:
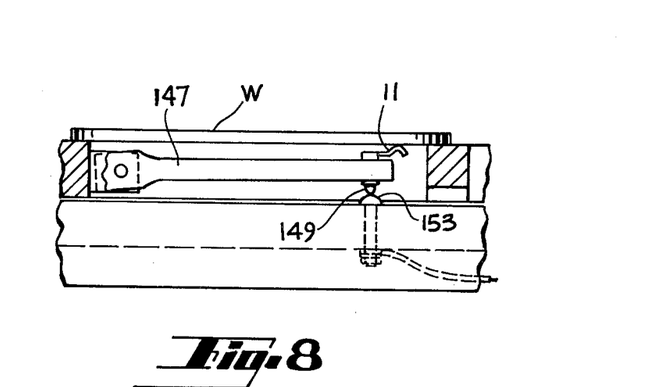
FIG. 8 is a second operational side sectional view of the mechanical detail of FIG. 6.

FIG. 8 shows the lever 147 in a raised position as the cam follower 149 is raised by the cam 153 forcing wire 11 into contact with wafer W. The stiffness of wire 11 is such that the wafer W is not raised. Instead, the wire 11 is bent slightly downwardly. This is achieved by using thin wire having a relatively long linear extended portion supporting an inverted V-shaped contact, similar to the wire configuration indicated in FIGS. 1 and 3.

Contact between the wire 11 and wafer W is only momentary. The lever arm 147 continues its motion, clearing the cam 153. The circuit of FIG. 2 is activated only for the brief instant, by sensors, not shown, when the wire 11 is making contact with cam 153 by means of the cam follower 149, as shown in FIG. 8. At other times, the electrical circuit of FIG. 2 may be in a standby mode.

Figure 9:
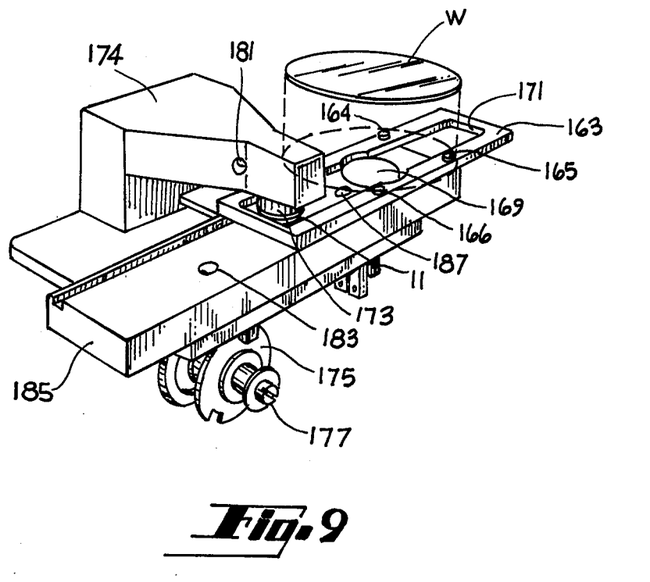
FIG. 9 is a perspective view of an alternate housing for the probe circuit shown in FIG. 1.

With reference to FIG. 9, a perspective view of a slightly modified housing for the circuit of FIGS. 1 and 2 is shown. FIG. 9 is similar to FIG. 3, except that a wafer is automatically transported over wire 11 which is supported near a guage head. The automatic transport of a wafer W is by means of a wafer transport onto which wafers are loaded, measured and then removed. Carrier 163 has pins 164, 165, 166 for centering the wafer W in a desired location. Carrier 163 has an elongated cutout region 171 which provides clearance for a turntable 169 to be elevated within the carrier and come into contact with wafer W in order to reposition the wafer, if desired. The elongated cutout region 171 has a length greater than an article to be measured, whereby carrier 163 encompasses the measurement head 173 supported by arm 174 at all times as the carrier moves back and forth. This is important because it enables the full diameter of a wafer, positioned on the carrier, to pass between the measurement head near where wire 11 of FIG. 1 is located in a fixed position. The upper surface of the carrier is slightly higher than the lower portion of the measurement head, so that an article on the carrier passes midway between the head. The motion of carrier 163 is programmed by a film desk 175 which is mounted on a hub by means of a removable screw 177. Film disk 175 is opaque except for a pattern of radial transparent stripes which are read by a photodetector.

Photo diodes are mounted on each side of head 173. For example, photo diode 181 is aimed angularly downward at photo detector 183 mounted within a hole in base member 185 which supports carrier 163. Another photo detector 187 is mounted in base member 185 on the opposite side of head 161 to receive light from a photo diode, not shown, near head 173.

The photo diodes serve to indicate the position of the wafer W within the gauge head so that wire 11 of FIG. 2 can be momentarily energized and wafer type determined.

What is claimed is:

1. An apparatus for determining the p or n-type conductivity of semiconductor material comprising:
a conductive wire disposed to contact a semiconductor material having a p or n-type conductivity characteristic for forming a diode therewith, said wire electrically coupled to a radio frequency oscillator through a capacitor in a manner such that radio frequency electrical energy is delivered to said wire from the oscillator,
and a dielectric covered conductor means supporting said semiconductor material for completing an electrical path for said radio frequency electrical energy, said capacitor having charge direction sensing means connected thereto for sensing the polarity of said diode whereby the p or n-type of semiconductor material may be determined.

2. The apparatus of claim 1 wherein said means supporting said semiconductor material comprises a dielectric material which is non-diffusing, relative to said semiconductor material, said dielectric material forming a coating over said conductor means.

3. The apparatus of claim 2 wherein said dielectric material is an anodizing coating and said conductor means includes an aluminum base.

4. The apparatus of claim 2 wherein said conductor is a wafer carrier having a grounding contact disposed for contacting said wafer to discharge static electricity thereon.

5. The apparatus of claim 3 wherein said conductor means is a semiconductor wafer carrier.

6. The apparatus of claim 1 wherein said charge direction sensing means comprises at least one voltage comparator connected to a reference voltage level.

7. The apparatus of claim 6 wherein said charge direction sensing means comprises first and second voltage comparators, each connected to a reference voltage level, one of said comparators for sensing p type conductivity, the other for sensing n type conductivity.

8. The apparatus of claim 1 wherein said conductive wire is connected to a movable wafer carrier in insulative movable relation therewith, said conductive wire supported by means for bringing said wire into contact with said semiconductor material only at specified carrier locations.

9. The apparatus of claim 1 further defined by a second conductive wire disposed to have a first end in contact with said wafer and having a second end connected as an electrical ground.

10. The apparatus of claim 9 further defined by a pistol grip housing for said oscillator, capacitor and charge direction sensing means, said housing having a barrel and a handle, said first and second conductive wires in parallel non-contacting relation emerging from said barrel for contacting said semiconductor material.

11. The apparatus of claim 1 further defined by a housing for said oscillator, capacitor and charge direction sensing means having a top region through which said conductive wire projects, said top region comprising said dielectric covered conductor means, said top region adapted to contact a wafer of semiconductor material.

12. The apparatus of claim 10 wherein said top region of said housing is a mesa having dimensions fitting between opposed rails of a wafer carrier.

13. The apparatus of claim 1 wherein said conductive wire is fixed and said semiconductor material is mounted on a movable wafer carrier.

14. An apparatus for determining the p or n-type conductivity of semiconductor material comprising,
a conductive support having a dielectric thereon interposed between said support and the position of semiconductor material to be supported,
a conductive wire disposed to contact said semiconductor material at a region for forming a diode at said region,
a capacitor having a first side connected to said conductive wire and a second side connected to a radio frequency oscillator, said oscillator delivering radio frequency electrical energy through said wire to said semiconductor material and through said dielectric to said conductive support, said conductive support arranged to form an electrical energy return path, charge direction sensing means connected to said capacitor for sensing the polarity of said diode, whereby the p or n-type of semiconductor material may be determined.

15. The apparatus of claim 14 wherein said charge direction sensing means comprises a first voltage comparator having one input connected to a reference voltage level of a first polarity and a second input connected to said capacitor.

16. The apparatus of claim 15 wherein said charge direction sensing means further comprises a second voltage comparator having one input connected to a reference voltage level opposite in polarity to said first polarity of said first voltage comparator and a second input connected to said capacitor whereby one comparator senses p type conductivity and the other senses n type conductivity.

17. The apparatus of claim 14 wherein said conductive support having a dielectric coating is an aluminum structure having an anodizing coating.

18. The apparatus of claim 14 wherein said conductive wire is connected to said support in insulative relation therewith, said conductive wire supported by means for bringing said wire into contact with said semiconductor material only at specified support locations.

19. The apparatus of claim 18 wherein said conductive wire is connected to an end of a pivoted lever, said lever forcing said wire into contact with said wafer upon passing a cam for said lever, said cam having an electrical connection for said wire.

20. The apparatus of claim 14 further defined by a second conductive wire disposed to have a first end in contact with said wafer and having a second end connected as an electrical ground.

21. The apparatus of claim 20 further defined by a pistol grip housing for said oscillator, capacitor and charge direction sensing means, said housing having a barrel and a handle, said first and second conductive wires in parallel non-contacting relation emerging from said barrel for contacting said semiconductor material 22. The apparatus of claim 14 further defined by a housing for said oscillator, capacitor and charge direction sensing means having a top region through which said conductive wire projects, said top region having said dielectric on an upper surface thereof adapted to support a wafer of semiconductor material with said wire in contact with the wafer.

23. The apparatus of claim 22 wherein said top region of said housing is a mesa having dimensions fitting between opposed rails of a wafer carrier.

24. The apparatus of claim 14 wherein said conductive wire is fixed and said semiconductor material is mounted on a movable wafer carrier.

25. A method for determining the p or n-type of a semiconductor material comprising, supporting a semiconductor material for unknown p or n-type conductivity with a dielectric material covering a conductive support structure such that a capacitive relation exists between the semiconductor material, the dielectric material and the conductive support structure, contacting a semiconductor material having a p or n-type conductivity characteristic at a region with a conductive wire thereby forming a diode, energizing said wire with radio frequency energy transmitted through a capacitor, the dielectric covered conductive support structure forming an electrical energy return path, sensing the direction of electrical charge of said capacitor and producing an output signal having a p or n polarity indication corresponding to the direction of electrical charge on said capacitor.

26. The method of claim 25 characterized by the capacitive relation existing between the semiconductor material, the dielectric material and the conductive support establishing a capacitance greater than the capacitance of said capacitor.

* * * * *

UNITED STATES PATENT AND TRADEMARK OFFICE
CERTIFICATE OF CORRECTION

PATENT NO. : 4,282,483

DATED : August 4, 1981

INVENTOR(S) : George J. Kren, Karel Urbanek and William R. Wheeler

It is certified that error appears in the above–identified patent and that said Letters Patent are hereby corrected as shown below:

Col. 2, line 26   "of the carrier"
should read --to the carrier--

Col. 3, line 12   "if the water W"
should read --if the wafer W--

Col. 3, line 50   "r.g. interference"
should read --r.f. interference--

Col. 7, line 37   "a film desk"
should read --a film disk--

Col. 10, line 18   Claim 25
"material for unknown"
should read --material of unknown--

Signed and Sealed this

Twenty-seventh Day of October 1981

[SEAL]

Attest:

GERALD J. MOSSINGHOFF

*Attesting Officer*     *Commissioner of Patents and Trademarks*